United States Patent
Sohda et al.

(10) Patent No.: US 8,704,175 B2
(45) Date of Patent: Apr. 22, 2014

(54) SCANNING ELECTRON MICROSCOPE

(75) Inventors: Yasunari Sohda, Kawasaki (JP);
Hiromasa Yamanashi, Kakamigahara (JP); Toru Yamanashi, legal representative, Kakamigahara (JP); Muneyuki Fukuda, Kokubunji (JP); Takeyoshi Ohashi, Tokyo (JP); Osamu Komuro, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/812,451

(22) PCT Filed: Aug. 26, 2011

(86) PCT No.: PCT/JP2011/004749
§ 371 (c)(1),
(2), (4) Date: Jan. 25, 2013

(87) PCT Pub. No.: WO2012/042738
PCT Pub. Date: Apr. 5, 2012

(65) Prior Publication Data
US 2013/0175447 A1 Jul. 11, 2013

(30) Foreign Application Priority Data
Sep. 30, 2010 (JP) ................................. 2010-220226

(51) Int. Cl.
*H01J 37/28* (2006.01)
(52) U.S. Cl.
USPC ........ 250/310; 250/307; 250/311; 250/396 R; 250/398; 250/399
(58) Field of Classification Search
USPC ............ 250/306, 307, 310, 311, 396 R, 397, 250/398, 399
See application file for complete search history.

(56) References Cited

U.S. PATENT DOCUMENTS

| | | | | |
|---|---|---|---|---|
| 5,894,124 A | * | 4/1999 | Iwabuchi et al. | 250/310 |
| 6,864,493 B2 | * | 3/2005 | Sato et al. | 250/491.1 |
| 7,126,120 B2 | * | 10/2006 | Inada | 250/307 |
| 7,335,893 B2 | * | 2/2008 | Pearl | 250/396 R |

(Continued)

FOREIGN PATENT DOCUMENTS

| JP | 7-262952 A | 10/1995 |
|---|---|---|
| JP | 2001-357811 A | 12/2001 |

(Continued)

OTHER PUBLICATIONS

International Search Report dated Oct. 18, 2011 w/English translation (three (3) pages).

*Primary Examiner* — Michael Logie
(74) *Attorney, Agent, or Firm* — Crowell & Moring LLP

(57) ABSTRACT

Provided is a scanning electron microscope equipped with a high-speed and high-precision astigmatism measuring means to be used when both astigmatism generated by an electron-beam column and astigmatism generated from the surroundings of a measuring sample exist. This scanning electron microscope is characterized in controlling an astigmatism corrector (201) with high-speed and high-precision, to correct the astigmatism, by using both a method of obtaining the astigmatism from the qualities of two-dimensional images to be acquired upon changing the intensity of the astigmatism corrector (201), and a method of measuring the astigmatism from the change in the position displacement of an electron beam that occurs when the electron beam is tilted using a tilt deflector (202).

14 Claims, 12 Drawing Sheets

(56) References Cited

U.S. PATENT DOCUMENTS

| | | |
|---|---|---|
| 7,381,951 B2 * | 6/2008 | Doi et al. .............. 250/310 |
| 7,605,381 B2 * | 10/2009 | Sato et al. ............. 250/491.1 |
| 2001/0050338 A1 | 12/2001 | Nomura |
| 2003/0006371 A1 | 1/2003 | Watanabe et al. |
| 2005/0161601 A1 * | 7/2005 | Kochi et al. ............ 250/311 |
| 2005/0236570 A1 * | 10/2005 | Morokuma et al. ...... 250/311 |
| 2006/0043293 A1 * | 3/2006 | Doi et al. .............. 250/310 |
| 2011/0147586 A1 * | 6/2011 | Fukuda et al. .......... 250/310 |
| 2013/0026361 A1 * | 1/2013 | Yamanashi et al. ...... 250/307 |

FOREIGN PATENT DOCUMENTS

| | | |
|---|---|---|
| JP | 2003-16983 A | 1/2003 |
| JP | 2004-146192 A | 5/2004 |
| JP | 2005-122933 A | 5/2005 |
| JP | 2007-141866 A | 6/2007 |
| WO | WO 2010/035416 A1 | 4/2010 |

* cited by examiner

FIG. 3A
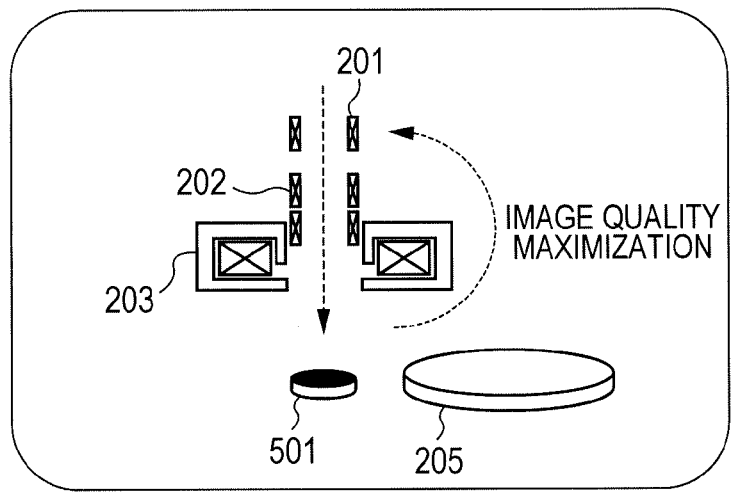
FIG. 3B
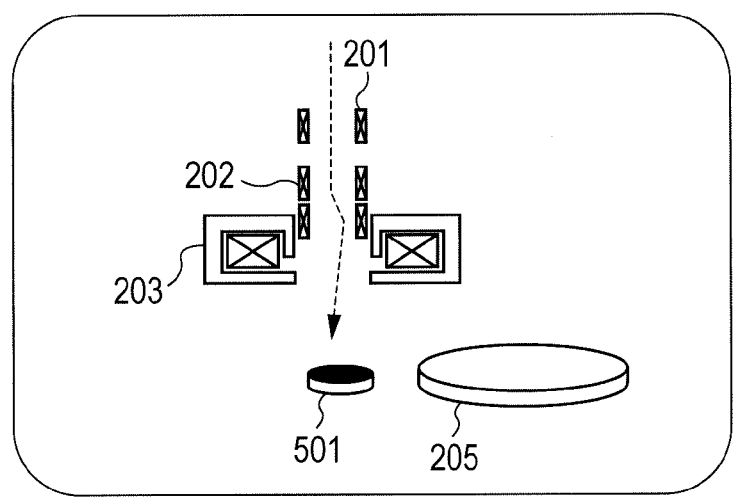
FIG. 3C
ASTIGMATISM           PARALLAX
CORRECTOR INTENSITY    METHOD
$$\begin{pmatrix} \Delta STX \\ \Delta STY \end{pmatrix} = \begin{pmatrix} a & b \\ c & d \end{pmatrix} \begin{pmatrix} \Delta S1 \\ \Delta S2 \end{pmatrix}$$

SCANNING ELECTRON MICROSCOPE

TECHNICAL FIELD

The present invention relates to an inspection and measurement apparatus using an electron beam.

BACKGROUND ART

A scanning electron microscope (SEM) used for observation, inspection and measurement of a sample using an electron beam accelerates electrons emitted from an electron source and irradiates the electrons so as to be converged onto the sample surface by an electrostatic or electromagnetic lens. They are called primary electrons. By incidence of the primary electrons, secondary electrons and reflective electrons are generated from the sample. By detecting these secondary electrons and reflective electrons while deflecting and scanning an electron beam, a scanning image of a fine pattern and a composition distribution on the sample can be acquired.

As problems in the scanning electron microscope, high speed and high accuracy correction of a focus error and astigmatism can be cited.

The most common method as the measurement method and correction method for astigmatism is a method for obtaining the astigmatism from the qualities of two-dimensional picture images acquired while changing the intensity of the astigmatism corrector. As an index of the picture quality, contrast of a picture image, sharpness of a contour of a pattern and the like are used, and measurement and correction of the astigmatism are executed by maximizing these indexes.

On the other hand, to use a method of measuring the astigmatism from the change in the position displacement of an electron beam which occurs when the electron beam is tilted has been proposed in Japanese Unexamined Patent Application Publication No. 2007-141866, Japanese Unexamined Patent Application Publication No. 2001-357811, Japanese Unexamined Patent Application Publication No. 2004-146192, Japanese Unexamined Patent Application Publication No. H07-262952 and the like. In Japanese Unexamined Patent Application Publication No. 2007-141866, it is disclosed that an electric current value of an astigmatism coil required for making the astigmatism quantity 0 is calculated based on the result of an astigmatism analysis by parallax, and an astigmatism correction coil is conditioned. In Japanese Unexamined Patent Application Publication No. 2001-357811, it is disclosed that the astigmatism is corrected using an astigmatism corrector based on information of an elliptical figure formed from an image displacement quantity by tilting. In Japanese Unexamined Patent Application Publication No. 2004-146192, it is disclosed that the astigmatism is corrected from the relation between the astigmatism quantity and the strength of an astigmatism correction coil that has been known beforehand from an image displacement quantity by tilting. In Japanese Unexamined Patent Application Publication No. H07-262952, it is disclosed that excitation control of an astigmatism correction coil is executed while observing image displacement by tilting.

CITATION LIST

Patent Literature

Patent Literature 1: Japanese Unexamined Patent Application Publication No. 2007-141866
Patent Literature 2: Japanese Unexamined Patent Application Publication No. 2001-357811
Patent Literature 3: Japanese Unexamined Patent Application Publication No. 2004-146192
Patent Literature 4: Japanese Unexamined Patent Application Publication No. H07-262952

SUMMARY OF INVENTION

Technical Problems

However, according to these methods for measuring the astigmatism from the change in the position displacement of an electron beam which occurs when the electron beam is tilted, only the astigmatism occurring below the position where the electron beam has been tilted can be measured. In these methods, when both astigmatism occurring by an electron beam column and astigmatism occurring by a measurement sample exist, accuracy of measurement and control becomes a problem.

On the other hand, according to a method of optimizing the quality of the corrected picture image while changing the intensity of the corrector for the astigmatism that occurs, it is necessary to acquire a number of picture images while changing the condition in order to acquire a most preferable image. Accordingly, in the method, time required for measurement and control becomes a problem.

Solution to Problems

These two problems can be solved by measuring the astigmatism occurring by an electron beam column by a first astigmatism measuring method obtaining the astigmatism from the qualities of two-dimensional picture images to be acquired while changing the intensity of the astigmatism corrector and measuring the astigmatism occurring from the surroundings of a sample by a second astigmatism measuring method measuring the astigmatism from the change in the position displacement of an electron beam which occurs when the electron beam is tilted.

Also, the relation between the astigmatism obtained by the first astigmatism measurement and the intensity of the astigmatism corrector can be solved by obtaining the astigmatism using the second astigmatism measuring method.

Advantageous Effects of Invention

According to the present invention, high-speed and highly accurate astigmatism measurement and astigmatism correction become possible by using both a method of obtaining the astigmatism from the qualities of two-dimensional picture images acquired while changing the intensity of the astigmatism corrector, and a method of measuring the astigmatism from the change in the position displacement of an electron beam which occurs when the electron beam is tilted.

BRIEF DESCRIPTION OF DRAWINGS

FIG. 3 is a drawing showing a calibration procedure of a parallax method (second astigmatism measuring method) in relation with the first embodiment.

DESCRIPTION OF EMBODIMENTS

First Embodiment

Figure 1:
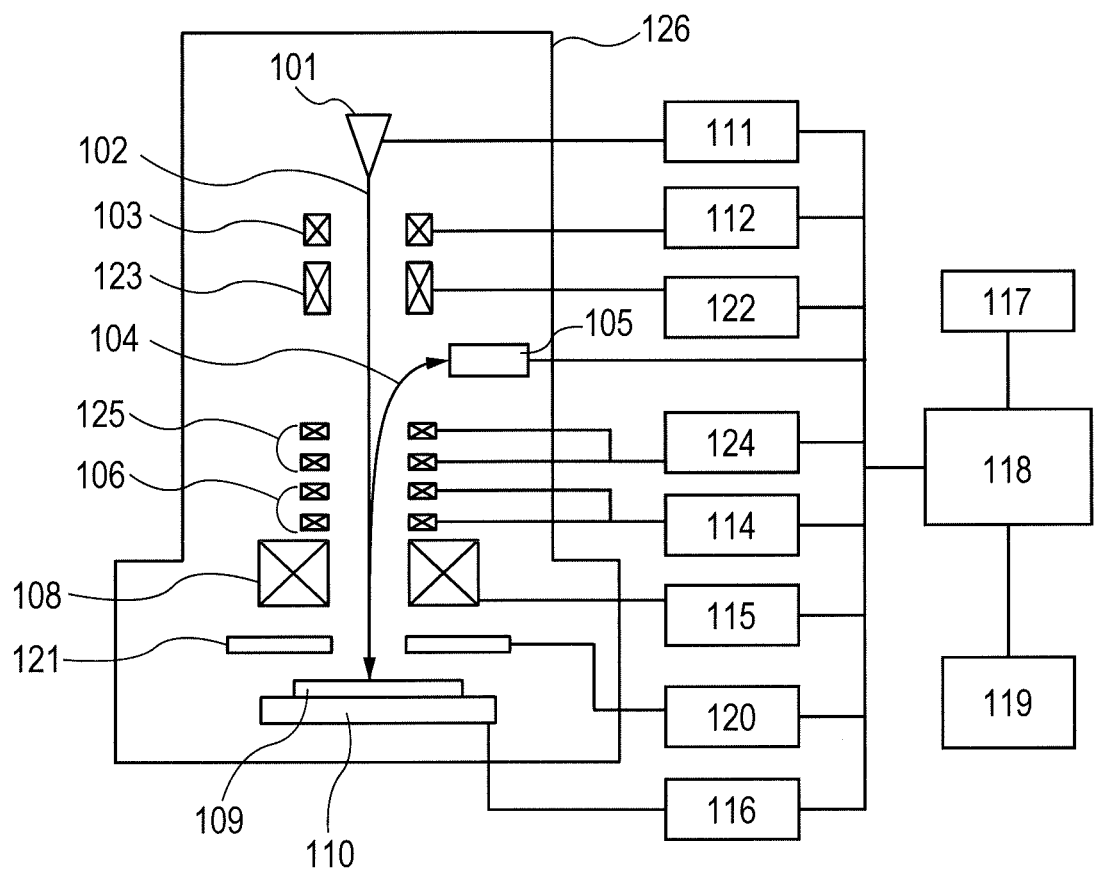
FIG. 1 is a total schematic view of a scanning electron microscope of the present embodiment.

FIG. 1 is a total schematic view of a scanning electron microscope used in an example of the present invention. An electron beam 102 emitted from an electron gun 101 is focused by a condenser lens 103 and an electromagnetic lens 108 on a sample 109 fixed to a holder 110. According to the present example, an objective lens is constituted mainly of the electromagnetic lens 108 and an electrostatic lens generated by an electric field between an electrostatic lens electrode 121 and the sample 109. Also, secondary electrons and reflective electrons 104 emitted from the sample 109 are detected by a detector 105 positioned generally in the middle of an electron beam column 126. The electron beam 102 on the sample 109 is scanned two-dimensionally by an electromagnetic deflector 106, and a two-dimensional picture image can be acquired as a result. The two-dimensional picture image is calculated by a control computing unit 118 of a total apparatus and is displayed on a display unit 119. In the electron beam column 126, an astigmatism corrector 123 capable of correcting the astigmatism and a tilt deflector 125 for tilting the electron beam further exist. However, co-use of the electromagnetic deflector 106 and the tilt deflector 125 is also possible. Also, the electron gun 101, condenser lens 103, astigmatism corrector 123, tilt deflector 125, electromagnetic deflector 106, electromagnetic lens 108, electrostatic lens electrode 121, and holder 110 are respectively connected to and controlled by the control computing unit 118 of the total apparatus through an electron gun controller 111, condenser lens control unit 112, astigmatism corrector control unit 122, tilt deflector control unit 124, electromagnetic deflector control unit 114, electromagnetic lens control unit 115, electrostatic lens electrode control unit 120, and a sample voltage control unit 116 respectively. Further, the control computing unit 118 of the total apparatus includes a recording device 117.

FIG. 2 shows in detail the electron beam column 126 of the scanning electron microscope shown in FIG. 1. Here, an objective lens 203 is constituted mainly of the electromagnetic lens 108 and an electrostatic lens generated by an electric field between the electrostatic lens electrode 121 and the sample 109 in FIG. 1. Measurement and a correction procedure of the astigmatism will be shown using FIG. 2. First, the astigmatism of the electron beam from an electron source inside the electron beam column 126 to the sample is measured and corrected by a first astigmatism measuring method that obtains the astigmatism from the qualities of a two-dimensional picture image acquired while changing the intensity of the astigmatism collector (hereinafter referred to as an image sharpness method) (FIG. 2A). Because the astigmatism is stable to some degree, measurement interval can be long, and it is not a problem to spend time on one measurement. One that is conductive and stable against the electron beam 102 is used as a sample 204 used then.

Next, a measurement sample 205 is brought in instead of the conductive sample 204, and the astigmatism from the objective lens 203 to the surroundings of the measurement sample 205 is measured by a second astigmatism measuring method that measures the astigmatism from the change in the position displacement of an electron beam that occurs when the electron beam is tilted by a tilt deflector 202 (hereinafter referred to as a parallax method) (FIG. 2B) When an insulating material sample such as a resist and a silicon oxide film for example on a silicon wafer is measured by a scanning electron microscope, because an insulator acquires a charge during a process flow, the astigmatism occurs. Because the astigmatism differs according to the wafer measured and the position inside the wafer, the astigmatism is required to be measured for each measuring point inside the wafer. In this case, it is effective to use high speed astigmatism measurement by the parallax method shown in FIG. 2B.

Further, the parallax method can be also used for measuring focus error. To discriminatingly use two kinds or more correction means including the parallax method efficiently is effective in focus correction also, and the correction means is applicable to astigmatism correction or focus correction, or both of the corrections. Focus correction will be described in second embodiment.

Figure 2A:
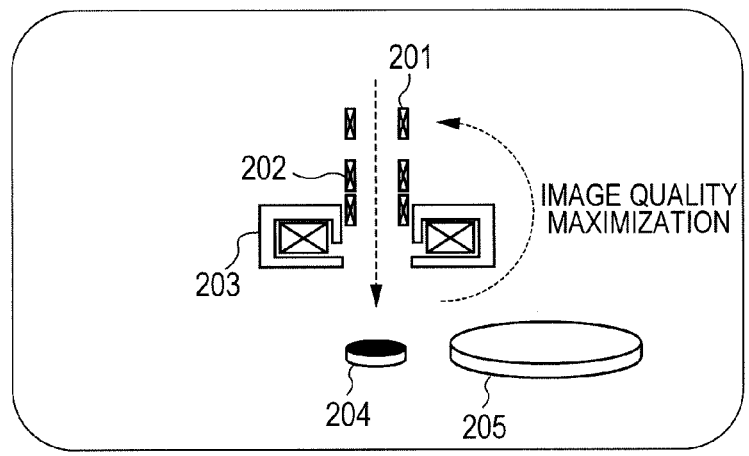
FIG. 2 is a drawing showing measurement and a correction procedure of the astigmatism in relation with the first embodiment.
Figure 2A:
Figure 2B:
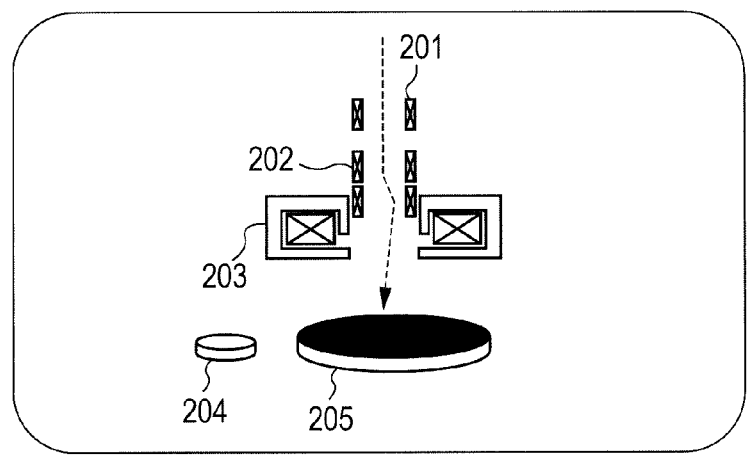
Figure 2B:
Figure 2C:
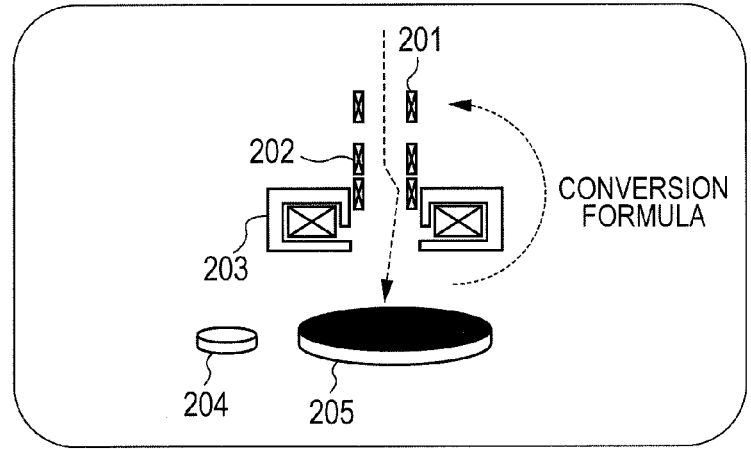

Next, a method for accurately feeding back the astigmatism measured to the intensity of the astigmatism corrector will be described. A means is provided in which the relation between the astigmatism measured by the image sharpness method and the strength change of an astigmatism corrector 201 required for correcting the astigmatism measured is stored beforehand in the storage device 117 as a calculation formula, and the astigmatism measured by the parallax method is fed back to the astigmatism corrector 201 by the astigmatism corrector control unit 122 as shown in FIG. 2C.

In this case, it is preferable that the deflector 202 that tilts the electron beam used for the parallax method is positioned below the astigmatism corrector 201. When the astigmatism corrector 201 is arranged below the tilt deflector 202, the astigmatism of the electron beam column changes and the intensity of the astigmatism corrector 201 changes, the astigmatism measured by the parallax method changes, and therefore the astigmatism caused purely by the sample 205 cannot be measured. Accordingly, in the present present example, the astigmatism corrector 201 was arranged above the tilt deflector 202 as shown in FIG. 1. Also, in the present example, a deflector defining the position of the electron beam on the sample 205 (the electromagnetic deflector 106 shown in FIG. 1) and the deflector 202 that tilts the electron beam (the tilt deflector 125 shown in FIG. 1) are separate, however, functions of the both can be co-used also by changing the strength in two steps and the deflection direction of the deflector 202 that defines the position on the sample 205.

FIG. 3 shows a calibration procedure of the parallax method. With respect to reference signs same with those of FIG. 2, description will be omitted. First, the astigmatism of an astigmatism measuring calibration sample 501 is measured using the image sharpness method, and the intensity change of the astigmatism corrector 123 required for correcting the astigmatism is obtained in the control computing unit 118 of the total apparatus (FIG. 3A). The intensity change obtained is stored in the storage device 117. Next, the astigmatism is measured by the parallax method (FIG. 3B). The astigmatism measured by the parallax method is stored in the storage device in a similar manner. Also, two measured data of the astigmatism corrector strength obtained using the image sharpness method and the astigmatism obtained using the parallax method are collated to each other in the control computing unit 118 of the total apparatus, and a calculation formula is obtained (FIG. 3C). Thereafter, calculation is executed by the control computing unit 118 of the total apparatus using the calculation formula, and feedback is executed from the astigmatism corrector control unit 122 to the astigmatism corrector 201.

Although the calculation formula can be obtained by polynominal approximation, because the astigmatism has components of two directions of the horizontal direction and the vertical direction, the calculation formula is expressed by a two-dimensional linear matrix here. Also, offset may possibly occur according to the initial state of the measurement, and it is also effective to add an offset term to the calculation formula. Further, when the calibration range is large, there is also a method using a two-dimensional polynominal equation.

A screen for selecting discriminating use of the astigmatism measurement described above is displayed on the display unit 119 shown in FIG. 1.

Figure 4:
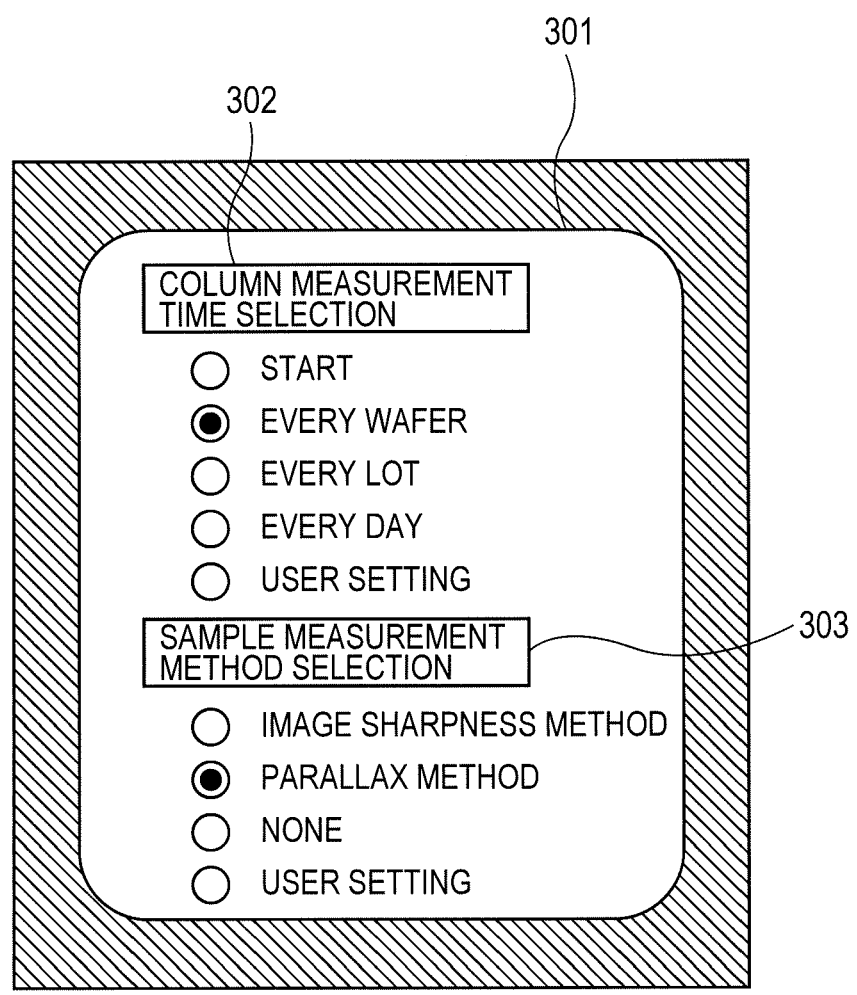
FIG. 4 is a drawing of an operation screen of an astigmatism measuring method showing azimuth directions of a tilt beam in relation with the first embodiment.

FIG. 4 shows the selection screen 301. On the screen, column measurement time selection 302 and sample measurement method selection 303 are displayed. The column measurement time selection 302 prepares plural options of a mode for starting immediately, a mode with different frequency of every wafer, every lot, every day, user setting for more flexible application, and the like. Because stability of the astigmatism caused by the electron beam column 126 (column) depends also on the device and a method for using it, it is configured that a user can manually select the frequency on the screen 301. The sample measurement method selection 303 includes respective modes of the image sharpness method, parallax method, none, and user setting. Also, four azimuth directions used in the present example at which the electron beam is tilted by the tilt deflector 125 are 0 deg, 90 deg, 225 deg, and 315 deg. The reason the azimuth directions are not symmetric with each other is that it is necessary to measure the astigmatism in different directions. In the present example, the astigmatism was obtained by combining the parallax in the direction parallel to the tilting azimuth direction and the parallax in the direction perpendicular to a different tilting azimuth direction. As a result, it became possible to utilize information of the parallax at the maximum and to obtain the astigmatism accurately. More specifically, the astigmatism in two directions was obtained using formulas respectively from the parallax in two parallel directions and the parallax in two orthogonal directions, the formulas being;

Astigmatism 1=(0 deg parallel parallax−90 deg parallel parallax−225 deg orthogonal parallax+315 deg orthogonal parallax)/2/tilting elevation angle Astigmatism 2=(0 deg orthogonal parallax−90 deg orthogonal parallax+225 deg parallel parallax−315 deg parallel parallax)/2/tilting elevation angle FIG. 5 shows a structure of the parallax method calibration sample 501 used in the calibration. For calibration of the parallax method, a sample generating stable astigmatism is required. However, in the conventional methods in which an insulating material sample is charged and the astigmatism is formed, reduction of the astigmatism by diffusion of the charges and change of the astigmatism by irradiation of the electron beam become impediments to stable calibration. In order to solve this problem, it is preferable to generate the astigmatism using a conductive sample.

Figure 5A:
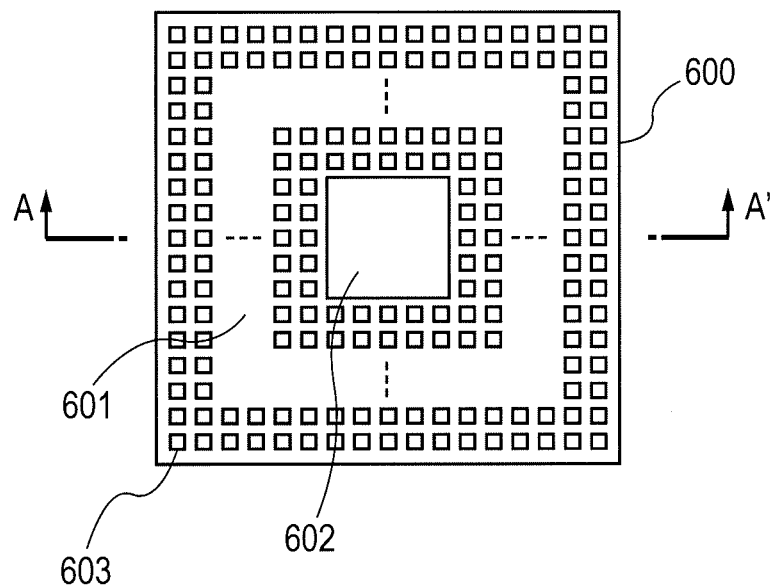
FIG. 5 is a structural drawing of a parallax method calibration sample in relation with the first embodiment.
Figure 5B:
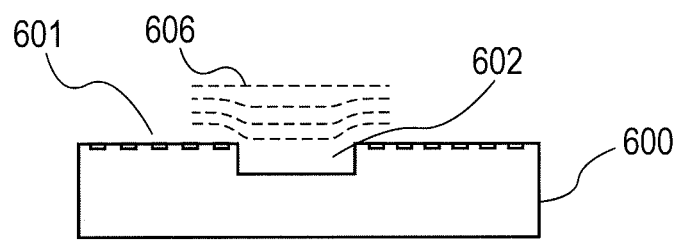

FIG. 5A is a plan view of the calibration sample, and FIG. 5B is a cross-sectional view taken from line A-A'. A sample 600 has steps by plural holes with different depth (or height). There is one large deep hole 602 in the center of the sample 600, and plural shallow holes 603 with the aperture smaller than that of the center deep hole 602 are arranged inside a calibration mark region 601 surrounding the deep hole 602. The large deep hole 602 has the aperture of 1 mm square and the depth (step) of 100 μm, and inflects an electrostatic retarding potential 606 in the vicinity of the step between the electrostatic lens electrode and the sample 600. By this curvature, an electric filed asymmetric with respect to the step is generated, which results in occurrence of the astigmatism.

Figure 6A:
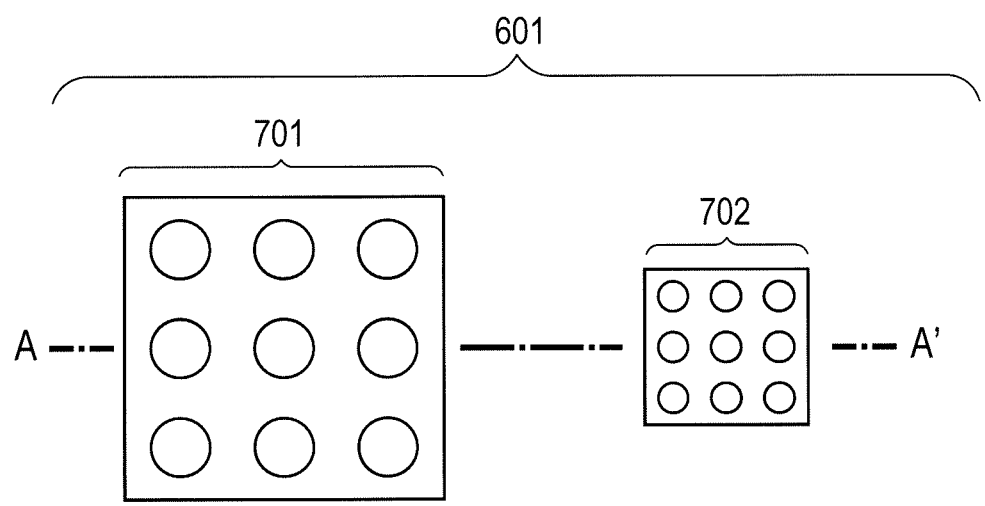
FIG. 6 is a drawing showing a calibration mark region of the parallax method calibration sample in relation with the first embodiment.
Figure 6B:
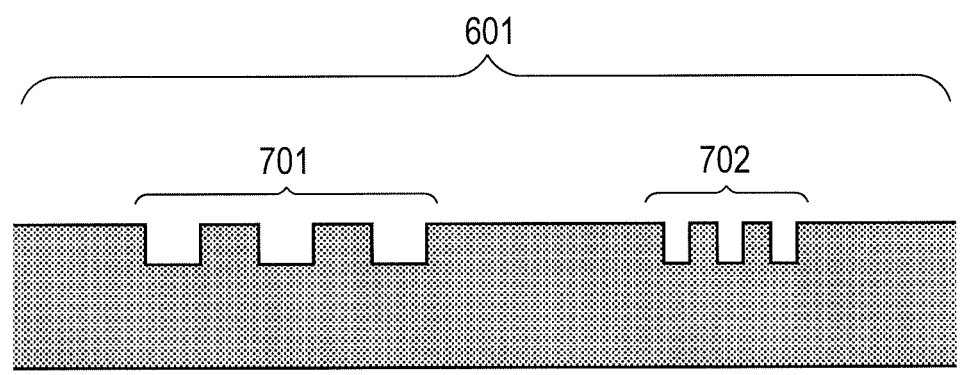

On the other hand, inside the calibration mark region 601, holes of hole arrays 701, 702 which are the calibration marks shown in FIG. 6 are formed. FIG. 6A is a plan view, and FIG. 6B is a cross-sectional view taken from line A-A'. Because the size of the optimum calibration mark 601 is different according to the image acquisition magnification, the hole arrays 701, 702 with different size are arranged within respective calibration mark regions 601. The depth of the holes is as shallow as 100 nm, is capable of forming holes with approximately 100 nm diameter used in calibration at high magnification, and the astigmatism can be thereby measured. Accordingly, the difference of double digits or more is caused in the depth (step) of the holes compared with the large deep holes 602.

Figure 7:
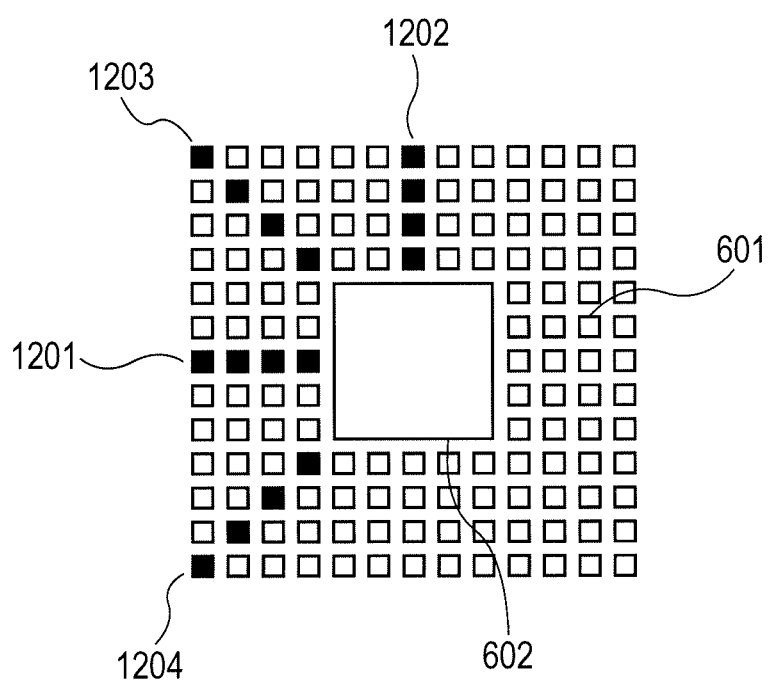
FIG. 7 is a layout drawing of a calibration mark in relation with the first embodiment.

FIG. 7 shows the positions of the calibration mark region used for calibration in the present embodiment. The positions used are arrayed in four azimuth directions around the large deep hole 602. An azimuth direction 1 1201 and an azimuth direction 2 1202 generate the astigmatism 1, and the signs thereof are opposite to each other. An azimuth direction 3 1203 that is an azimuth direction rotated by 45 deg and an azimuth direction 4 1204 generate the astigmatism 2, and the signs thereof are opposite to each other. Accordingly, for calibration of the parallax method, the calibration marks of at least two azimuth directions, preferably four azimuth directions are required.

By discriminatingly using functions of the holes as described above, stable astigmatism measurement becomes possible. Also, in order to inflect the electrostatic retarding potential 606, the aperture of the large deep hole 602 and an aspect ratio of the step are preferable to be low, and, in order to increase the measurement accuracy of the astigmatism, the aspect ratio is preferable to be high. Accordingly the preferable structure is that the aspect ratio of the large deep hole 602 is smaller than the aspect ratio of the small aperture and shallow holes 603. Also, inflecting of the electrostatic retarding potential 606 and measurement of the astigmatism can be achieved by a step of a projection also instead of a step of the hole. Further, although square holes were used in the present example, in order to further reduce azimuth direction dependency of the magnitude of the astigmatism generated, circular holes are also effective.

Figure 8:
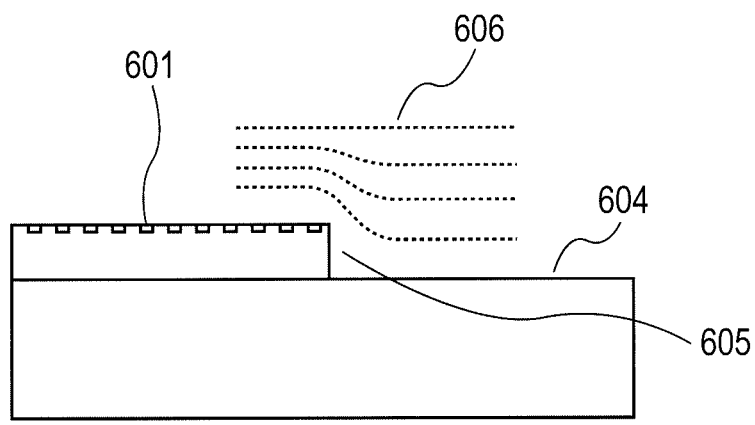
FIG. 8 is a structural drawing of a parallax method calibration sample in relation with the first embodiment.

Also, as a simple method, there is a method utilizing an end 605 of a sample shown in FIG. 8. That is a structure including the end 605 with a step larger than the depth of the shallow holes 603 at an end of the plural small aperture and shallow holes 603 for measuring the astigmatism. In the structure, there is a demerit of uneven change in the astigmatism, however, the structure functions effectively when the astigmatism measured is small.

Figure 9:
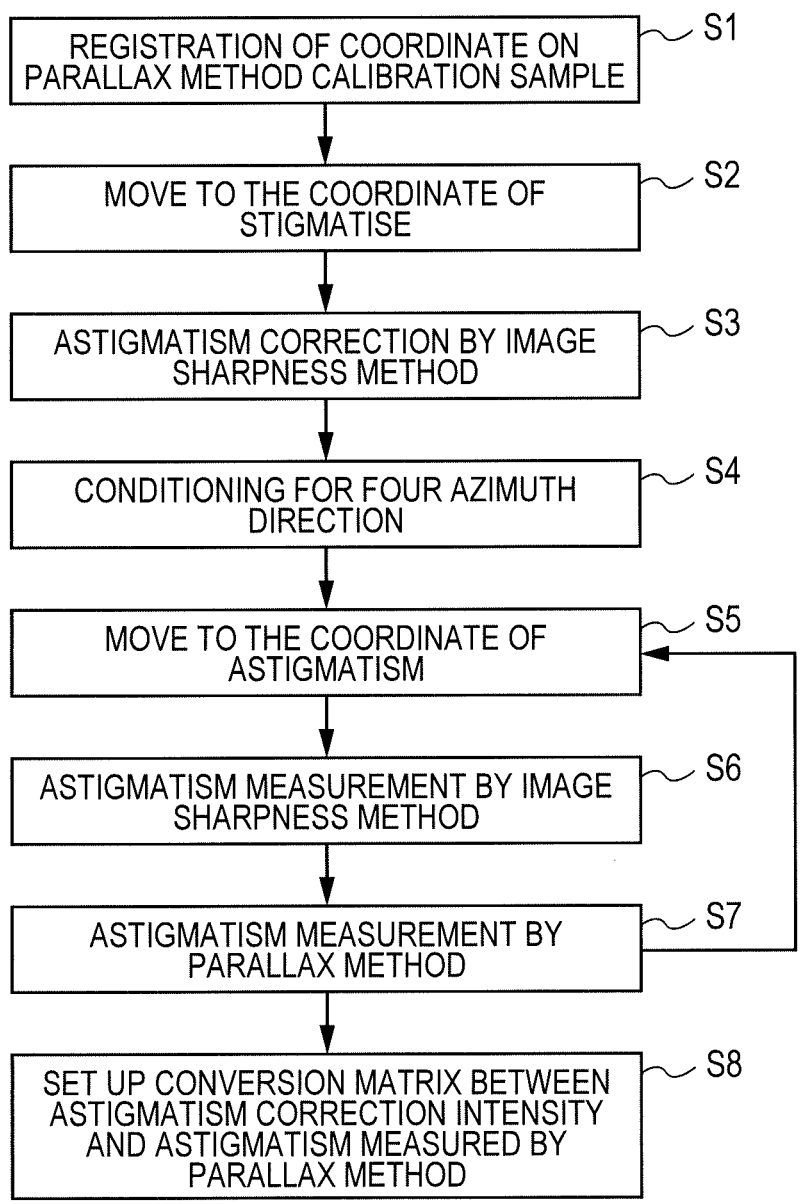
FIG. 9 is a calibration flowchart of a parallax method of an operation screen of calibration of the parallax method in relation with the first embodiment.

FIG. 9 shows a flowchart of calibration of a parallax method. First, an operator manually inputs a coordinate to be measured on the calibration sample and registers it in the storage device (S1). Next, the electron beam is moved to a coordinate originated and without the astigmatism to the calibration mark region 601 that is sufficiently apart from the large deep hole 602 or the end 605 of a large step by the tilt deflector control unit 124 (S2). There, astigmatism correction is executed by the image sharpness method (S3). Further, after the tilt beam formation conditions of four azimuth directions are adjusted (S4), the electron beam 102 is moved to a coordinate having the astigmatism by the tilt deflector control unit 124 (S5). At the coordinate, astigmatism measurement by the image sharpness method (the value is obtained as the intensity change of the astigmatism corrector 123) (S6) and astigmatism measurement by the parallax method (S7) are executed. Measurement at the coordinate having the astigmatism is executed by the number of the registered points.

From plural data obtained thus, a transformation matrix of the intensity change of the astigmatism corrector and the astigmatism by the second astigmatism measuring method are obtained by the control computing unit of the total apparatus (S8). As a result, it becomes possible to feed back the astigmatism measured by the second astigmatism measuring method to the astigmatism corrector by the astigmatism corrector control unit 122. Also, in the example, the coordinate to be measured was selected so as to depart in plural directions from the large deep hole 602 and the end 605. Thus, it becomes easy to cope with various astigmatisms that possibly occur on the sample.

Figure 10:
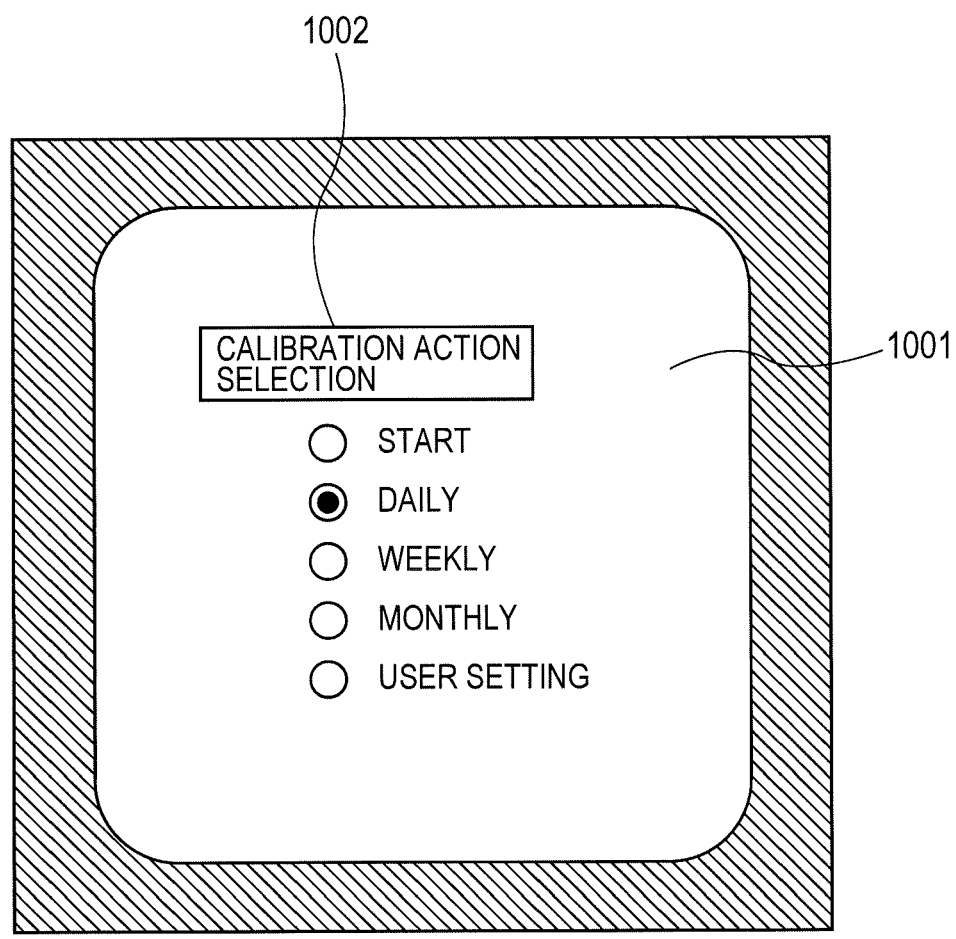
FIG. 10 is a drawing showing an operation screen of a calibration action of the parallax method.

In the present example, frequency of calibration of the parallax method is made selective. Frequency of calibration depends on accuracy required for the device and stability of the device. FIG. 10 shows an operation screen 1001 of calibration action selection 1002. Plural options of a mode of starting immediately, a mode with different frequency such as daily, weekly, and monthly, and a user setting mode are prepared.

Figure 11A:
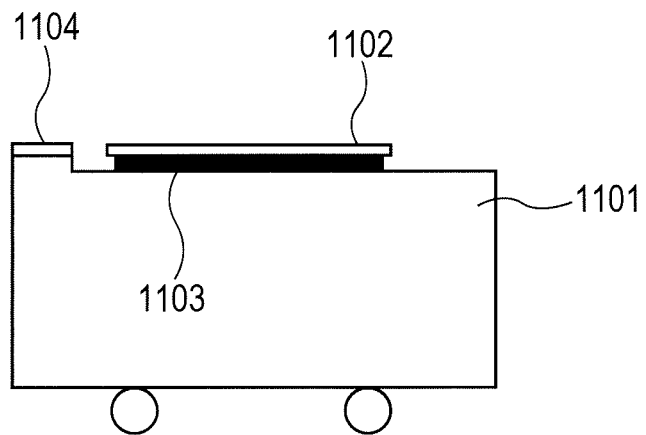
FIG. 11 is a drawing showing a method for setting the parallax method calibration sample.

Also, with respect to a method for arranging the calibration samples 501, 600, two methods shown in FIG. 11 were employed. FIG. 11A shows a case using an electrostatic chuck 1103. In this case, because only a measurement sample 1102 comes in to and goes out from a stage 1101, a parallax method calibration sample 1104 is arranged on the stage.

Figure 11B:
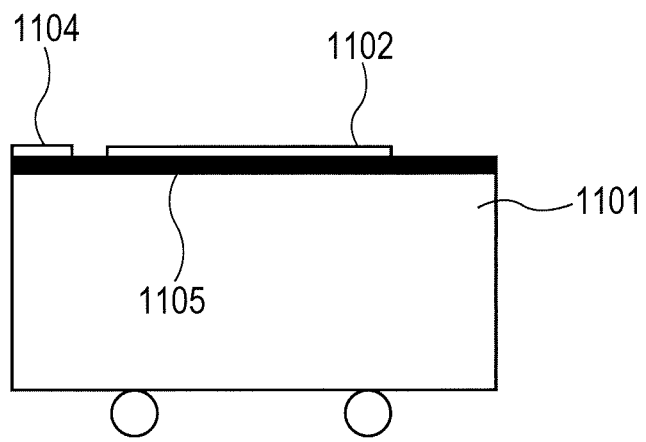

On the other hand, FIG. 11B shows a case using a sample holder 1105. In this case, because the sample holder 1105 also comes in to and goes out from the stage, the parallax method calibration sample 1104 is arranged on the sample holder 1105.

By using the means described above, application of the parallax method to astigmatism correction became possible. Also, these actions can be executed automatically by respective control units. Thus, the astigmatism correcting action which took 3 s per one measuring point in the past could be shortened to 1 s. Also, measurement reproducibility in a pattern region where measurement of the astigmatism by the image sharpness method was difficult such as an end of a line pattern also improved, and reproducibility of 200 nm astigmatism could be obtained. Thus, degree of freedom of the pattern that could be used for astigmatism correction could be significantly widened.

Second Embodiment

A second embodiment will be described according to the total schematic view of a scanning electron microscope shown in FIG. 1. The electron beam 102 emitted from the electron gun 101 is focused on the sample 109 by the condenser lens 103 and the electromagnetic lens 108. According to the present embodiment, an objective lens is constituted mainly of the electromagnetic lens 108 and an electrostatic lens generated by an electric field between the electrostatic lens electrode 121 and the sample 109. Also, by changing the intensity of the electromagnetic lens 108 that is a part of the objective lens, the focus position of the electron beam can be changed. According to the parallax method, not only the astigmatism but also focus error can be measured. Focus error can be measured by obtaining an average value of the parallax when tilted in four directions by the tilt deflector 202. More specifically, a formula below is used.

Focus error=(0 deg parallel parallax+90 deg parallel parallax+225 deg parallel parallax+315 deg parallel parallax)/4/tilting elevation angle Because this method uses same measurement data used for astigmatism measurement, simultaneous measurement of the astigmatism and focus error can be said to be possible. The focus error measured can be corrected by being fed back to the electromagnetic lens 108 by the electromagnetic lens control unit. When focus measurement only is enough, tilting in four directions is not necessary. For example, it is possible to use a formula below with tilting in two directions only.

Focus error=(0 deg parallel parallax+180 deg parallel parallax)/2/tilting elevation angle When this method is used, although it is limited to focus correction, quicker measurement becomes possible by the rate that the number of the direction is less.

Figure 12A:
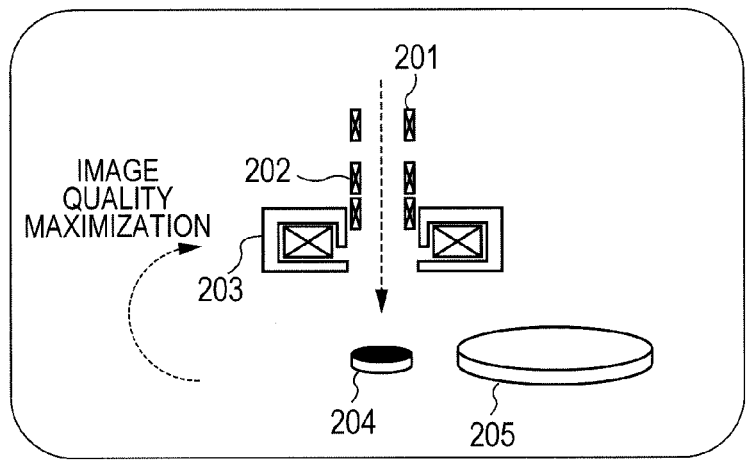
FIG. 12 is a drawing showing measurement and a correction procedure of focus error in relation with the second embodiment.

FIG. 12 shows measurement and a correction procedure of focus error in the present example. Description of the constitution similar to measurement and correction procedure of the astigmatism shown in FIG. 2 will be omitted. First, with respect to focus error by an electron optical element inside the electron beam column (column), the focus error is corrected while focus error measurement and the objective lens 203 are controlled by irradiating an electron beam to the conductive sample 204 and evaluating the quality of a two-dimensional picture image by the image sharpness method (first focus error measuring method) (FIG. 12A). Because this focus error is stable to some degree, the measurement interval can be long, and, even if one measurement takes time, it is not a problem. With respect to the conductive sample 204 used then, one that is stable against an electron beam is to be used.

Figure 12B:
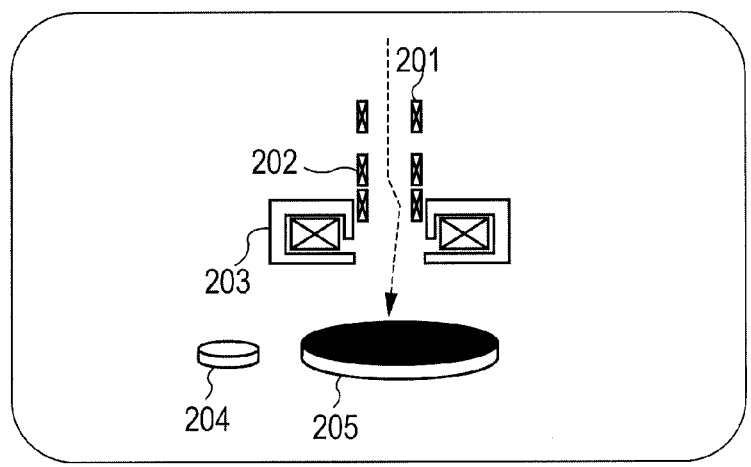

Next, the measurement material 205 is brought in, and focus error from the objective lens 203 to the surroundings of the measurement material 205 is measured by the parallax method from the change in the position displacement of an electron beam which occurs when the electron beam is tilted by the tile deflector (FIG. 12B). When an insulating material sample such as a resist and a silicon oxide film for example on a silicon wafer is measured by a scanning electron microscope, because an insulator acquires a charge during a process flow, focus error occurs. Because the focus error differs according to the wafer measured and the position inside the wafer, the focus error is required to be measured for each measuring point. Accordingly, in this case, high speed focus error measurement by the parallax method shown in FIG. 12B (second focus error measuring method) is used.

Figure 12C:
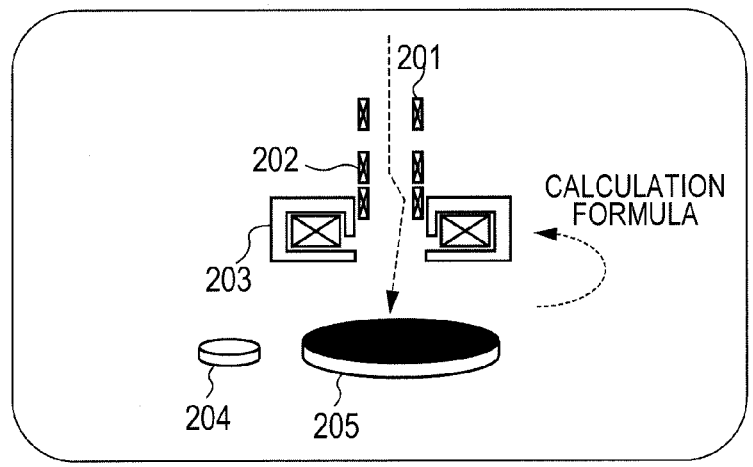

The measurement result is fed back from the control unit to the objective lens 203 using the calculation formula as shown in FIG. 12C. Also, in the parallax method, because the astigmatism also can be measured simultaneously, feedback of the astigmatism to the astigmatism corrector 205 is also possible simultaneously. Further, when it is obvious that the cause of the focus error is charging of the measurement sample 205, focus correction can be executed also by changing the electric potential applied to the measurement sample 205 by the sample voltage control unit 116.

LIST OF REFERENCE SIGNS

101 ... electron gun, 102 ... electron beam, 103 ... condenser lens,
104 ... secondary electron and reflective electron,
105 ... detector, 106 ... electromagnetic deflector,
108 ... electromagnetic lens, 109 ... sample, 110 ... holder,
111 ... electron gun controller, 112 ... condenser lens control unit, 114 ... electromagnetic deflector control unit,
115 ... electromagnetic lens control unit, 116 ... sample voltage control unit, 117... storage device, 118 ... control calculation unit of total apparatus, 119 ... display unit,
120... electrostatic lens control unit, 121 ... electrostatic lens electrode, 122 ... astigmatism corrector control unit,
123 ... astigmatism corrector, 124 ... tilt deflector control unit, 125 ... tilt deflector, 126 ... electron beam column,
201 ... astigmatism corrector, 202 ... tilt deflector,
203 ... objective lens, 204 ... conductive sample,
205 ... measurement sample, 301 ... selection screen,
302 ... column measurement time selection item, 303 ... sample measurement method selection item, 501 ... parallax method calibration sample, 600 ... parallax method calibration sample,
601 ... calibration mark region, 602 ... large deep hole,
603 ... small aperture and shallow hole, 604 ... calibration sample, 605 ... end, 606 ... electrostatic retarding potential,
701 ... low magnification hole array, 702 ... high magnification hole array, 1001 ... selection screen, 1002 ... calibration action selection item, 1101 ... stage, 1102 ... measurement sample, 1103 ... electrostatic chuck, 1104 ... calibration sample,
1105 ... sample holder, 1201 ... azimuth direction 1,
1202 ... azimuth direction 2, 1203 ... azimuth direction 3,
1204 ... azimuth direction 4

The invention claimed is:

1. A scanning electron microscope that irradiates an electron beam emitted from an electron source onto a sample and acquires a sample image based on secondary electrons and reflective electrons generated from the sample, comprising:
a tilt deflector arranged inside an electron beam column and for tilting the electron beam;
an astigmatism corrector arranged inside the electron beam column and capable of correcting astigmatism of the electron beam;
an objective lens that converges the electron beam and irradiates the electron beam onto the sample; and
a control unit that controls the tilt deflector and the astigmatism corrector, wherein
the control unit measures astigmatism of the electron beam from the electron source to the sample inside the electron beam column by a first astigmatism measuring method, and measures astigmatism of the electron beam occurring from the objective lens to surroundings of the sample by a second astigmatism measuring method.

2. The scanning electron microscope according to claim 1, wherein
the first astigmatism measuring method is a method for obtaining the astigmatism from quality of a two-dimensional picture image acquired while changing intensity of the astigmatism corrector by the control unit;
the second astigmatism measuring method is a method for measuring the astigmatism occurring when the electron beam is tilted by the control unit; and
the control unit controls the astigmatism corrector based on relation between the astigmatism obtained by the first astigmatism measuring method and the intensity of the astigmatism corrector and the astigmatism obtained by the second astigmatism measuring method.

3. The scanning electron microscope according to claim 2, wherein
the first astigmatism measuring method that obtains the astigmatism from quality of a two-dimensional picture image acquired while changing intensity of the astigmatism corrector by the control unit is an image sharpness method; and
the second astigmatism measuring method that measures the astigmatism occurring when the electron beam is tilted by the control unit is a parallax method.

4. The scanning electron microscope according to claim 2, wherein
the control unit collates astigmatism obtained by the first astigmatism measuring method and astigmatism obtained by the second astigmatism measuring method to each other, and changes intensity of the astigmatism corrector based on a calculation formula obtained beforehand.

5. The scanning electron microscope according to claim 2, wherein
the astigmatism corrector is positioned on the upstream side of the tilt deflector in the advancing direction of the electron beam.

6. The scanning electron microscope according to claim 2, wherein
the tilt deflector obtains astigmatism of different directions by combining parallax in the direction parallel to tilting azimuth direction and parallax in the direction orthogonal to tilting azimuth direction that is different from the tilting direction.

7. The scanning electron microscope according to claim 6, wherein
relation between the astigmatism and intensity of the astigmatism corrector is obtained using a calibration sample including a plurality of steps with different height or depth.

8. The scanning electron microscope according to claim 7, wherein
the calibration sample has a first step in the center part; and
a plurality of second steps smaller than the first step are provided around the first step.

9. The scanning electron microscope according to claim 7, wherein
an aspect ratio of height or depth and width of the first step is smaller than an aspect ratio of height or depth and width of the second step.

10. A scanning electron microscope that irradiates an electron beam emitted from an electron source onto a sample and acquires a sample image based on secondary electrons and reflective electrons generated from the sample, comprising:
a tilt deflector arranged inside an electron beam column and for tilting the electron beam;
an electromagnetic lens that two-dimensionally scans the electron beam on the sample; and
a control unit that controls the tilt deflector and the electromagnetic lens, wherein
focus error of the electron beam from the electron source to the sample inside the electron beam column is measured by a first focus error measuring method, and focus error of the electron beam occurring from the electromagnetic lens to surroundings of the sample is measured by a second focus error measuring method.

11. The scanning electron microscope according to claim 10, wherein the first focus error measuring method is a method for obtaining the focus error from quality of a two-dimensional picture image acquired while changing intensity of the electromagnetic lens by the control unit;

the second focus error measuring method is a method for measuring the focus error occurring when the electron beam is tilted by the control unit; and the control unit controls the electromagnetic lens based on relation between the focus error obtained by the first focus error measuring method and intensity of the electromagnetic lens and the focus error obtained by the second focus error measuring means.

12. The scanning electron microscope according to claim 11, wherein the first focus error measuring method that obtains the focus error from quality of a two-dimensional picture image acquired while changing intensity of the electromagnetic lens by the control unit is an image sharpness method; and the second focus error measuring method that measures the focus error occurring when the electron beam is tilted by the control unit is a parallax method.

13. The scanning electron microscope according to claim 11, wherein the control unit collates focus error obtained by the first focus error measuring method and focus error obtained by the second focus error measuring method to each other, and changes intensity of the electromagnetic lens based on a calculation formula obtained beforehand.

14. The scanning electron microscope according to claim 13, wherein focus error of an electron beam is measured by obtaining an average value of parallax when tilted in four directions by the tilt deflector.

* * * * *